(12) United States Patent
Wyatt et al.

(10) Patent No.: US 7,316,461 B2
(45) Date of Patent: Jan. 8, 2008

(54) INDOOR-OUTDOOR EQUIPMENT ENCLOSURE AND METHOD FOR ASSEMBLING THE SAME

(75) Inventors: Brendan Wyatt, Shanghai (CN); Barry Kiernan, Shanghai (CN)

(73) Assignee: Viasystems Group, Inc., Clayton, MO (US)

( * ) Notice: Subject to any disclaimer, the term of this patent is extended or adjusted under 35 U.S.C. 154(b) by 0 days.

(21) Appl. No.: 11/500,106

(22) Filed: Aug. 7, 2006

(65) Prior Publication Data

US 2006/0267464 A1 Nov. 30, 2006

Related U.S. Application Data

(63) Continuation of application No. 10/444,665, filed on May 23, 2003, now Pat. No. 7,086,707.

(60) Provisional application No. 60/382,839, filed on May 23, 2002.

(51) Int. Cl.
*A47B 47/00* (2006.01)
(52) U.S. Cl. .................... 312/352; 312/265.4
(58) Field of Classification Search ................ 312/352, 312/257.1, 265.1, 265.2, 265.3, 265.4, 265.5; 211/26, 189, 191
See application file for complete search history.

(56) References Cited

U.S. PATENT DOCUMENTS

| | | | |
|---|---|---|---|
| 1,631,718 A | 6/1927 | Campbell | |
| 3,620,588 A | 11/1971 | Ferdinand et al. | |
| 3,901,571 A | 8/1975 | Begitschke et al. | |
| 4,045,104 A | 8/1977 | Peterson | |
| 4,625,471 A | 12/1986 | Cheng | |
| 4,941,717 A | 7/1990 | Beaulieu | |
| 4,997,240 A | 3/1991 | Schmalzl et al. | |
| 5,020,866 A | 6/1991 | McIlwraith | |
| 5,022,719 A * | 6/1991 | Amstutz et al. | ............ 312/140 |
| 5,250,752 A | 10/1993 | Cutright | |
| 5,372,262 A | 12/1994 | Benson et al. | |
| 5,380,083 A | 1/1995 | Jones et al. | |
| 5,537,795 A * | 7/1996 | Dias | ............ 52/586.2 |
| 5,574,251 A | 11/1996 | Sevier | |
| 5,647,650 A | 7/1997 | Daugherty et al. | |
| 5,897,180 A | 4/1999 | Singer | |
| 6,120,206 A | 9/2000 | Benner et al. | |
| 6,168,249 B1 | 1/2001 | Chien | |

FOREIGN PATENT DOCUMENTS

FR 2689328 10/1993

\* cited by examiner

*Primary Examiner*—James O. Hansen
(74) *Attorney, Agent, or Firm*—Dunlap, Codding & Rogers, P.C.

(57) ABSTRACT

A cabinet for supporting electronic equipment. The cabinet has a rigid internal assembly structure and a cladding kit. The internal assembly defines a cavity into which the electronic equipment can be fitted. The internal assembly structure has height, a plurality of posts, and at least two panels. Each of the panels has a plurality of recesses formed therein. At least one post includes mounting tabs positionable within the recesses formed within the panels for precisely locating the post with respect to the panels. The cladding kit has at least two post trims connected to the internal assembly structure and at least one panel connected to the post trims. Each of the post trims has a body member, a first connector and a second connector. The first connector and the second connector of the post trim cooperate to connect the post trim to the posts of the internal assembly structure.

2 Claims, 6 Drawing Sheets

INDOOR-OUTDOOR EQUIPMENT ENCLOSURE AND METHOD FOR ASSEMBLING THE SAME

CROSS-REFERENCE TO RELATED APPLICATIONS

The present application is a continuation of U.S. Ser. No. 10/444,665, filed May 23, 2003, now U.S. Pat. No. 7,086,707 which claims priority under 35 U.S.C. § 119 to the provisional patent application identified by U.S. Ser. No. 60/382,839, which was filed on May 23, 2002, the entire content of which is incorporated herein by reference for all purposes.

STATEMENT REGARDING FEDERALLY SPONSORED RESEARCH AND DEVELOPMENT

Not applicable.

BACKGROUND OF THE INVENTION

The present invention relates to enclosures used to house electronic equipment. More particularly, the present invention relates to a modular enclosure for use indoors or outdoors built around a structural "space frame" into which the internal equipment is fitted.

Equipment enclosures are used for holding cabinet-mounted electronic equipment, such as servers and telecommunications equipment, where environmental and other concerns require that the equipment be enclosed. The electronic equipment is configured with flanges for mounting to a cabinet.

In a preferred embodiment, the present invention is drawn to a modular enclosure for a European Telecommunications Standards Institute (ETSI) conforming equipment cabinet and is based on a structural "space frame" into which the internal equipment is fitted. The internal assembly structure is designed specifically for product specific loading requirements. The "space frame" concept allows free access from front, rear, and sides of the cabinet during the internal assembly stage. When the internal assembly is completed, then a cladding kit comprising extruded post trims, side panels and rear panel are "snapped on" using compression fittings. The top cover and door are fitted mechanically. An indoor or outdoor enclosure can be constructed by using different materials to fabricate components of the enclosure.

BRIEF SUMMARY OF THE INVENTION

It is an object of the present invention to provide an enclosure to meet the market requirements for telecommunications indoor and outdoor enclosure applications.

It is another object of the invention to provide a modular design based around an internal assembly structure into which internal equipment is fitted.

It is a further object of the invention to provide an internal assembly structure that is designed specifically for product specific loading requirement.

It is yet another object of the invention to provide free access from front rear and sides of the cabinet during the internal assembly stage.

It is another object of the invention to facilitate external assembly using a cladding kit consisting of extruded post trims, side panels and rear panel that are fitted to the internal assembly structure using compression fittings.

It is another object of the invention to provide an enclosure suitable for outside use by using a cladding kit consisting of materials suitable for exposure to the outside environment.

It is yet another object of the invention to provide an enclosure that can be shipped unassembled and easily assembled on site where the electronic components are to be installed.

It is yet another object of the invention to provide an enclosure that can be shipped as a so-called "flat pack" that greatly reduces bulk and, thus, shipping costs.

DETAILED DESCRIPTION OF THE INVENTION

Figure 1:
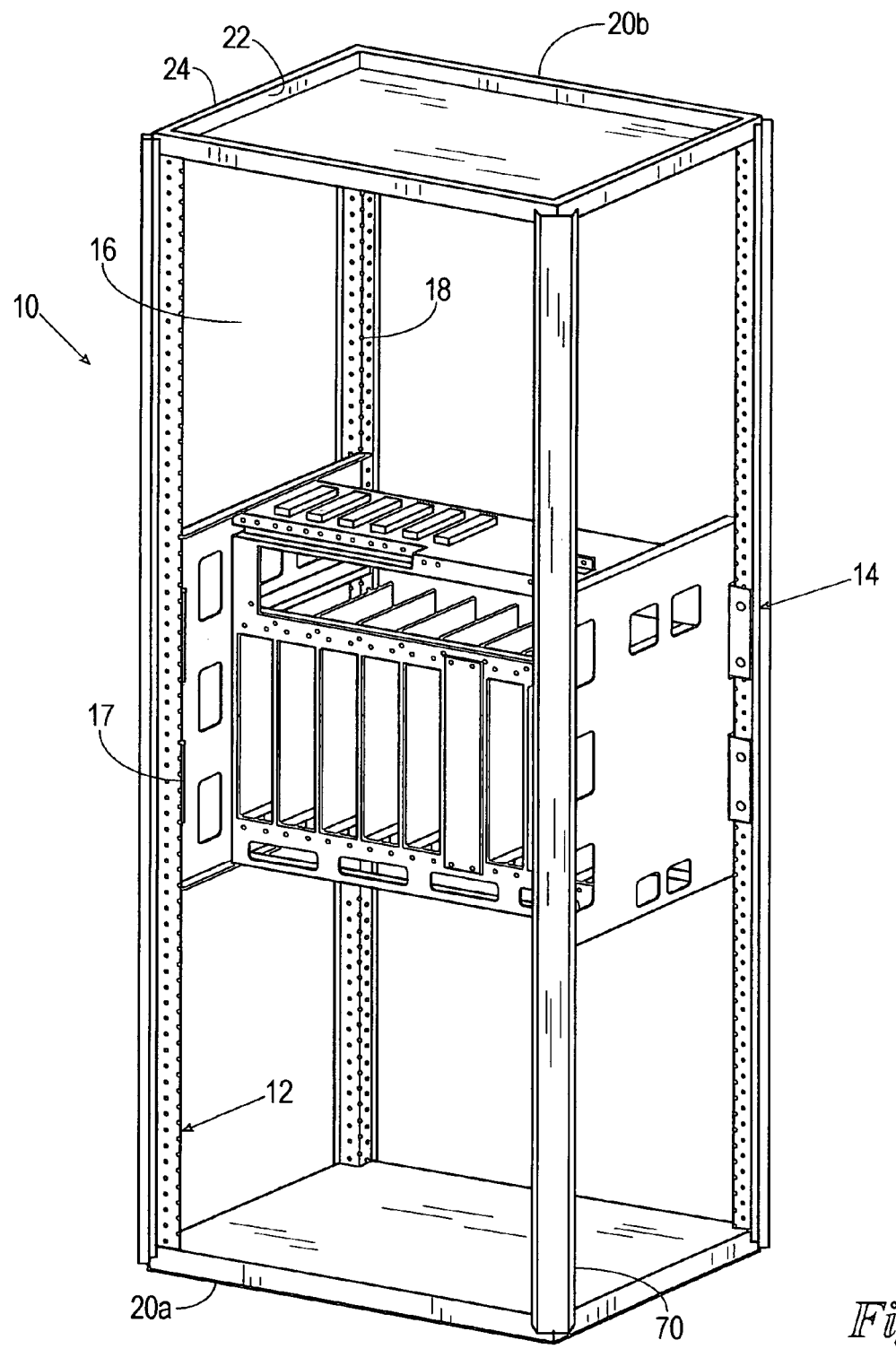
FIG. 1 is a perspective view of a rack or cabinet constructed in accordance with the present invention.

Referring now to the drawings, and more particularly to FIG. 1, shown therein and designated by reference numeral 10 is a rack or cabinet constructed in accordance with the present invention. In one preferred embodiment, the cabinet 10 is designed as an ETSI conforming equipment cabinet. The cabinet 10 has a rigid internal assembly structure 12 and an external assembly structure 14 or cladding kit. The internal assembly structure 12 has a height and defines a cavity 16 which is typically used for supporting or holding electronic equipment. A chassis structure 17 is provided and mounted in the center of the cavity 16.

Figure 2:
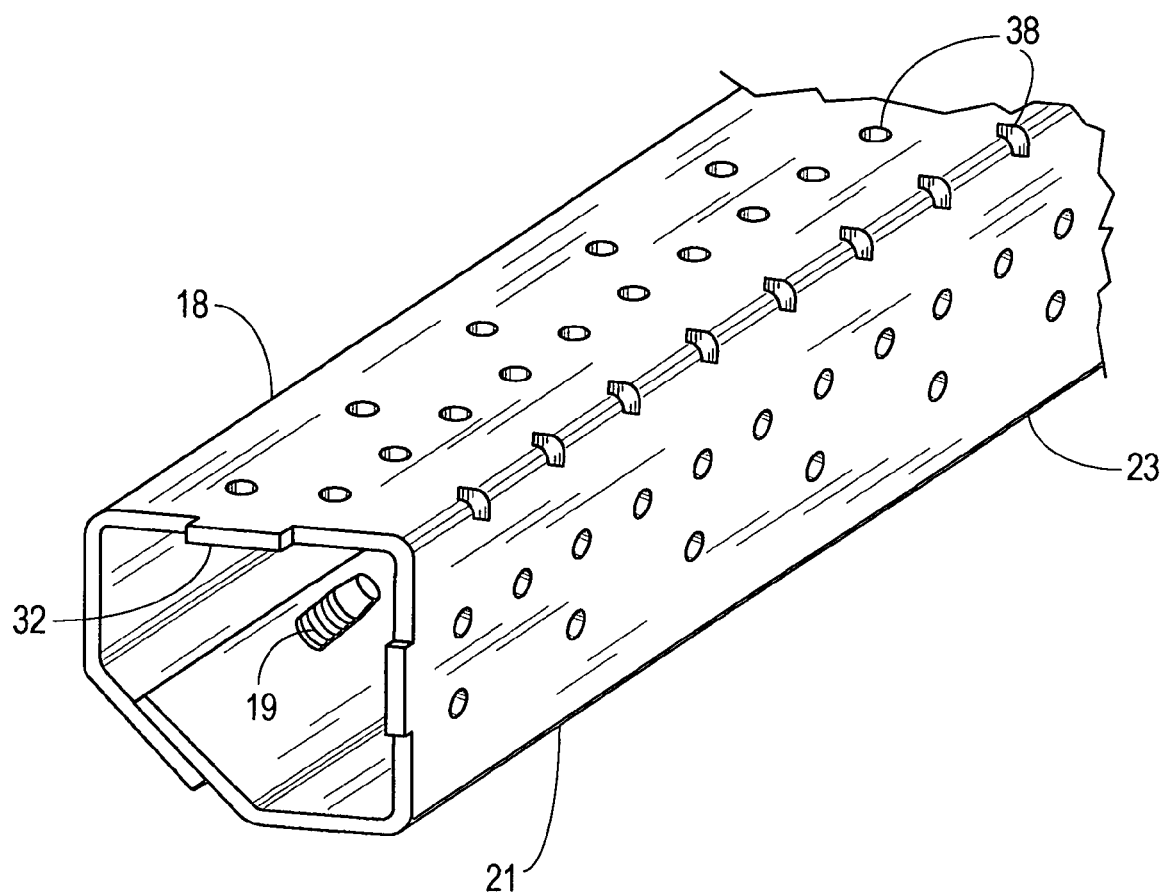
FIG. 2 is a partial, perspective view of a post in accordance with the present invention.

The internal assembly structure 12 is also provided with a plurality of posts 18, as shown in FIGS. 1 and 2. At least one post 18 (and preferably all of the posts 18) is constructed from a flat sheet of material in a similar manner as described in U.S. Pat. No. 6,974,036, issued on Dec. 13, 2005, the entire content of which is hereby incorporated herein by reference. The flat sheet of material is prepared before bending by generating all of the holes, cutouts, and notches that the post 18 will require for mounting the electronic equipment to the post 18. Preferably hard press tooling, such as pre-drilling, is used to form all the holes and shapes. The sheet of material is bent into a closed box configuration forming the post 18 and secured with screws 19. The post 18 has a first portion 21 and a second portion 23. The first portion 21 and the second portion 23 can be separate corners of the post 18, or indentations or slots or shoulders formed on or in the post 18.

In the preferred embodiment, the post 18 design incorporates the ETSI mounting pattern, however, this is not meant as a limitation. The mounting can be modified to include other mounting centers, if required or desired.

The internal assembly structure 12 also has at least two panels 20a and 20b. In one preferred embodiment, the lower panel 20a and the upper panel 20b are identical in construction and function. For this reason, when describing the construction of the lower panel 20a or upper panel 20b, such panels will simply be referred to as the "panel 20".

The cabinet 10 will be described hereinafter as the ETSI conforming equipment cabinet wherein the lower and upper panels 20a and 20b have a rectangular shape. However, it should be understood that the cabinet 10 does not have to be an ETSI conforming equipment cabinet and, in such case, the lower and upper panels 20a and 20b can be formed of any geometric, asymmetric, or fanciful shape. Further, the posts 18 can be positioned on any location with respect to the lower panel and upper panels 20a and 20b.

The lower and upper panels 20a and 20b are horizontally disposed and parallel to each other. Each of the panels 20 is provided with a horizontal wall 22 having an outer peripheral edge 24 (see FIG. 3). A plurality of slots 30 are formed in the horizontal wall 22 for receiving complimentary tabs 32 formed on an end of the posts 18.

Figure 3:
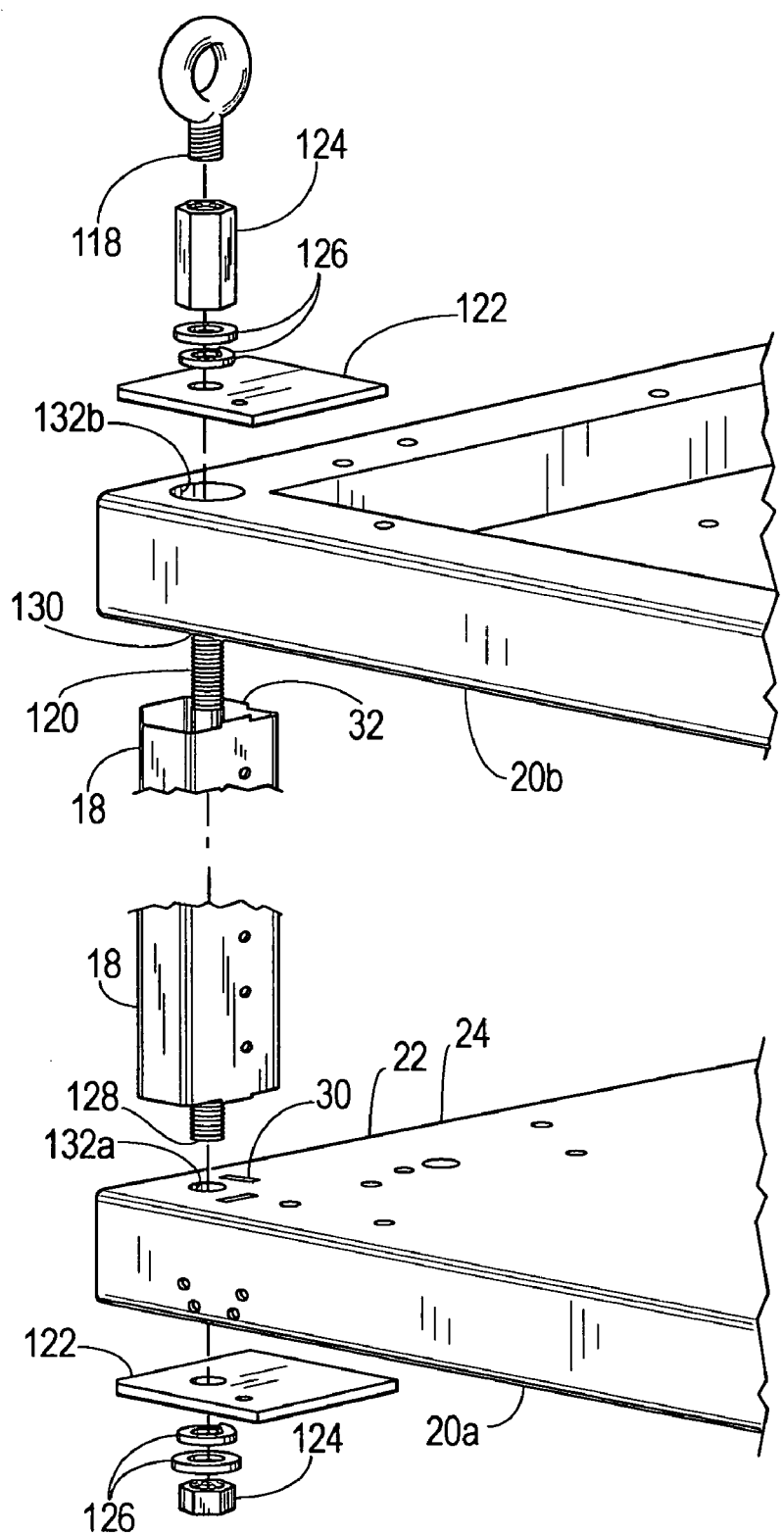
FIG. 3 is a partial, perspective view of the post of FIG. 2 being attached to lower and upper panels constructed in accordance with the present invention.

As shown in FIG. 3, the post 18 is desirably precisely located with respect to the lower panel 20a and upper panel 20b when the cabinet 10 is assembled. In one preferred embodiment, the post 18 forms a corner post of a rectangular cabinet. The post 18 is aligned with the lower and upper panels 20a and 20b by the tab 32 and corresponding slots 30 formed between the post 18 and lower and upper panels 20a and 20b. To connect the post 18 to the lower and upper panels 20a and 20b at least one opening is provided in the lower and upper panels 20a and 20b to receive corresponding fastening devices, such as screws and bolts. The post 18 is also provided with various openings 38 and cutouts for connecting the post 18 to the chassis structure 17.

Figure 4:
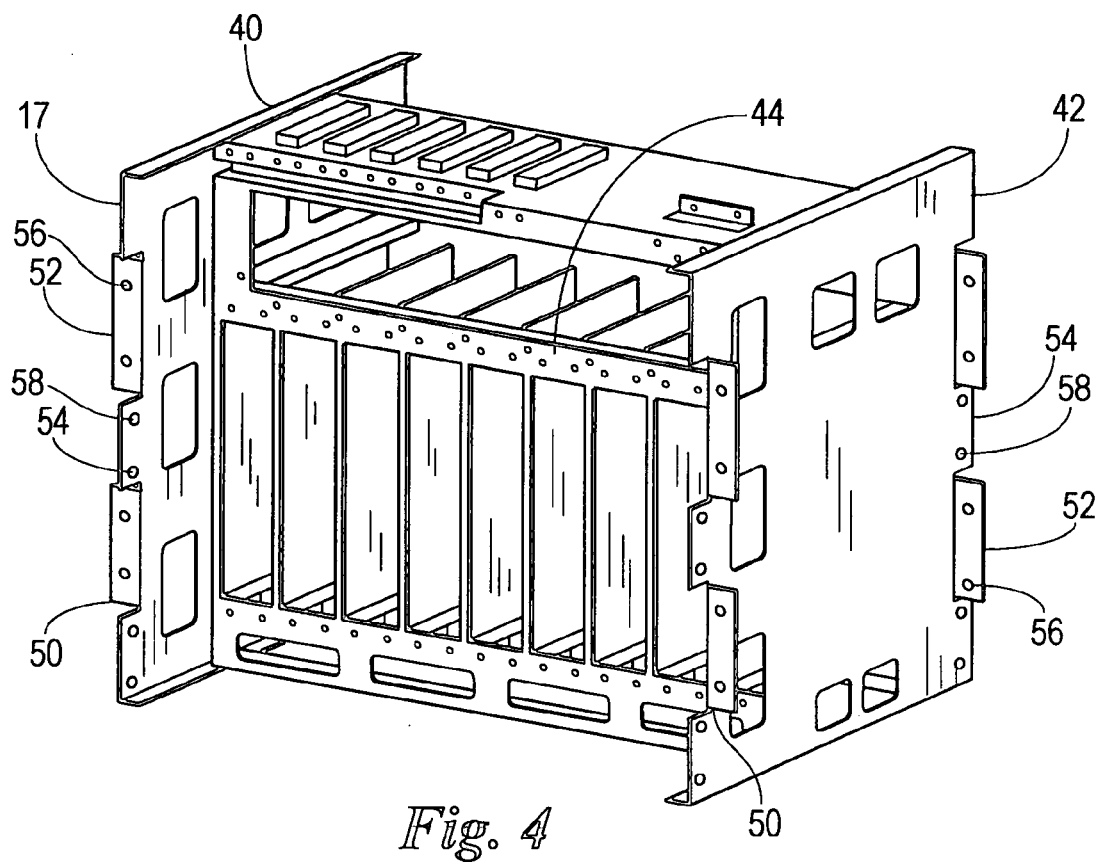
FIG. 4 is a perspective view of a chassis structure constructed in accordance with the present invention.

Referring to FIG. 4, the chassis structure 17 is shown. The chassis structure 17 has a first structure member 40 and a second structure member 42. The first structure member 40 and the second structure member 42 are connected by an equipment rack 44. In a preferred embodiment, the chassis structure 17 is connected to the internal assembly structure 12 with a twin axis mounting system 50 provided on the first and second structure members 40 and 42 for mounting the electronic equipment to the internal assembly structure 12. It should be understood that a variety of custom designed internal mounting frames, chassis, shelves, brackets, swing frames, and supports can be added to the chassis structure 17 as required to fix, house, or support customer defined equipment.

Figure 5:
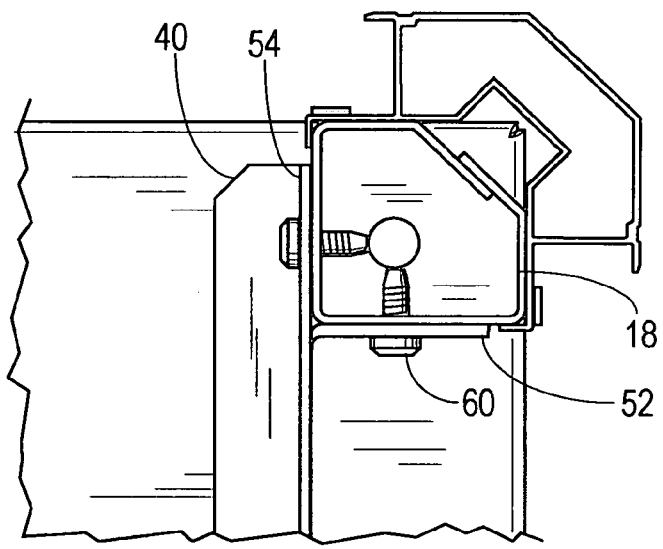
FIG. 5 is a top view of a twin axis mounting system of the chassis structure of FIG. 4.
Figure 6:
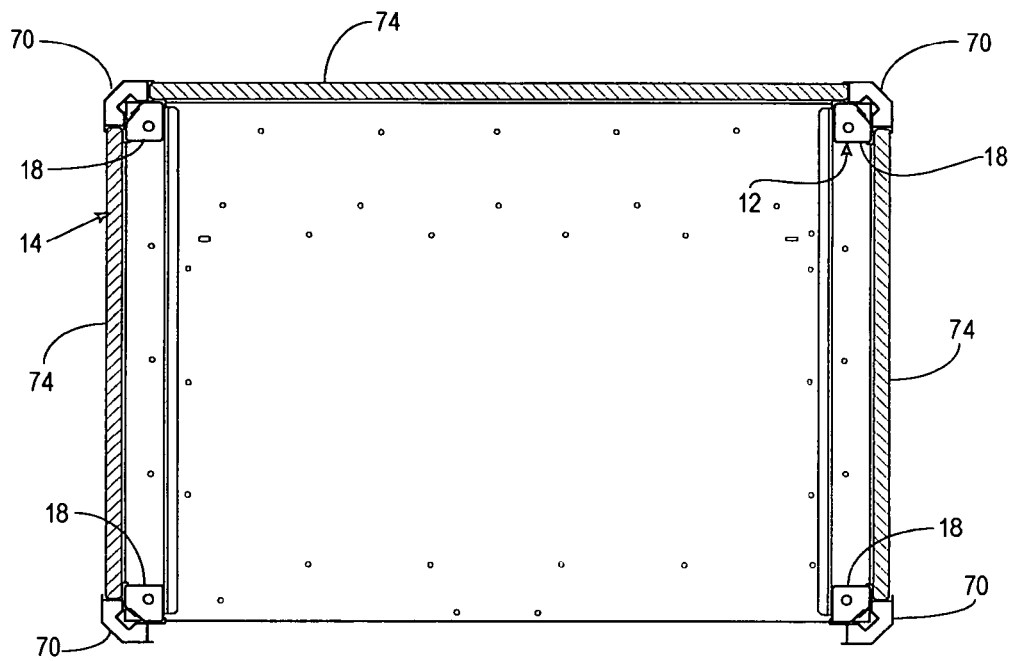
FIG. 6 is a top view of a plurality of panels assembled to the cabinet of FIG. 1 in accordance with the present invention.

As shown in FIGS. 4 and 5, the twin axis mounting system 50 is provided with at least one first axis mounting flange 52 and at least one second axis mounting flange 54. To connect the chassis structure 17 to the post 18, each mounting flange 52 and 54 is provided with at least one opening 56 and 58 to receive corresponding fastening devices 60, such as bolts and screws to connect the post 18 through corresponding openings 38 of the post 18. The twin axis mounting system 50 significantly increases both the structural load limit and the frame structural strength of the present invention. Using this internal concepts the strength/rigidity of the framework can effectively be increased as and where necessary to support whatever internal loading arrangements are required by the customer.

Referring to FIGS. 1, 6, 7 and 8, the external assembly structure 14 is shown having four post trims 70 identical in construction and function and three panels 74 connected to the post trims 70. However, it should be understood that the present invention may be constructed in a variety of ways having at least two post trims connected to the internal assembly structure and at least one panel connected to the post trims.

Each post trim 70 is connected to each of the corner posts 18 of the internal assembly structure 12. Each of the post trims 70 has a body member 80, a first connector 82, and a second connector 84. The body member 80 has a first side 86 and a second side 88. The first connector 82 is connected to the first side 86 of the body member 80. The second connector 84 is connected to the second side 88 of the body member 80. The first connector 82 and the second connector 84 cooperate between an unsecured position (FIG. 7) and a secured position (FIG. 8) to connect the post trim 70 to the post 18.

The first connector 82 has an L-shaped flange 90 extending from the body member 80 and a shoulder 92 spaced a distance away from the L-shaped flange 90 to form a channel 96. The channel 96 is sized and dimensioned to matingly receive an edge 98 of one of the panels 74.

The second connector 84 has an L-shaped flange 100 extending from the body member 80 and a shoulder 102 spaced a distance away from the L-shaped flange 100 to form a channel 104. The channel 104 is sized and dimensioned to matingly receive an edge 98 of one of the panels 74.

The panel 74, in a preferred embodiment, is a flat, rectangular-shaped piece which is positioned between two posts 18 and connected to the post trim 70. However, it should be understood that the panel 74 may be formed into any shape necessary in providing interconnection between two posts.

Figure 9:
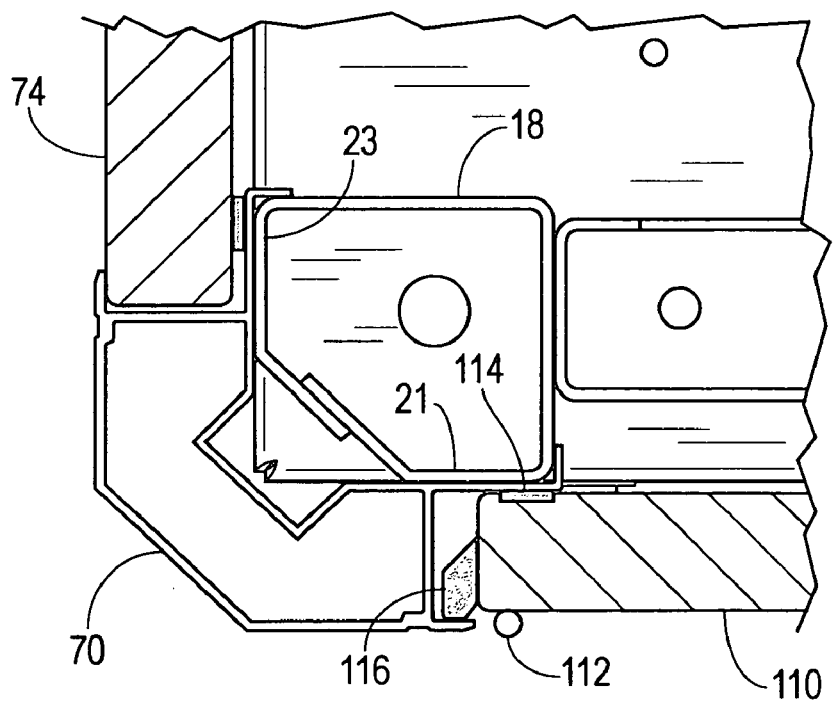
FIG. 9 is a top view of the cabinet having a door.

Referring to FIG. 9, a door 110 shaped like the panel 74 is received by the post trim 70 in place of the panel 74. A pivot point 112 is provided for opening and closing the door 110. It should be understood that the present invention accommodates single or a double doors. Additionally, different ventilation and material variations can be applied. Hinge types and locking systems can vary also depending on the door requirement. An electromagnetic containment (EMC) seal 114 is shown situated between the door 110 and the post trim 70. Sufficient compression is ensured by plastic compression blocks 116.

To assemble the cabinet 10, the tab from each post 18 is positioned in the corresponding slot formed in the lower panel 20a and the upper panel 20b. The post 18 is then secured in this position via a connection assembly 118 (see FIG. 3). In one preferred embodiment, the connection assembly 118 includes a tie bar 120, a pair of tension spreader plates 122, and a plurality of nuts 124 and washers 126. The tie bar 120 extends through the post 18, and first and second ends 128 and 130 of the tie bar 120 extend through openings 132a and 132b formed in the lower panel 20a and the upper panel 20b. The tension spreader plates 122, the washers 126 and the nuts 124 are positioned on the tie bar 120 adjacent the first and second ends 128 and 130 so that the tension spreader plates 122 are positioned generally between the nuts 124 and the respective upper and lower panels 20a and 20b. This process is repeated to connect each of the posts 18 to the upper and lower panels 20a and 20b.

Figure 7:
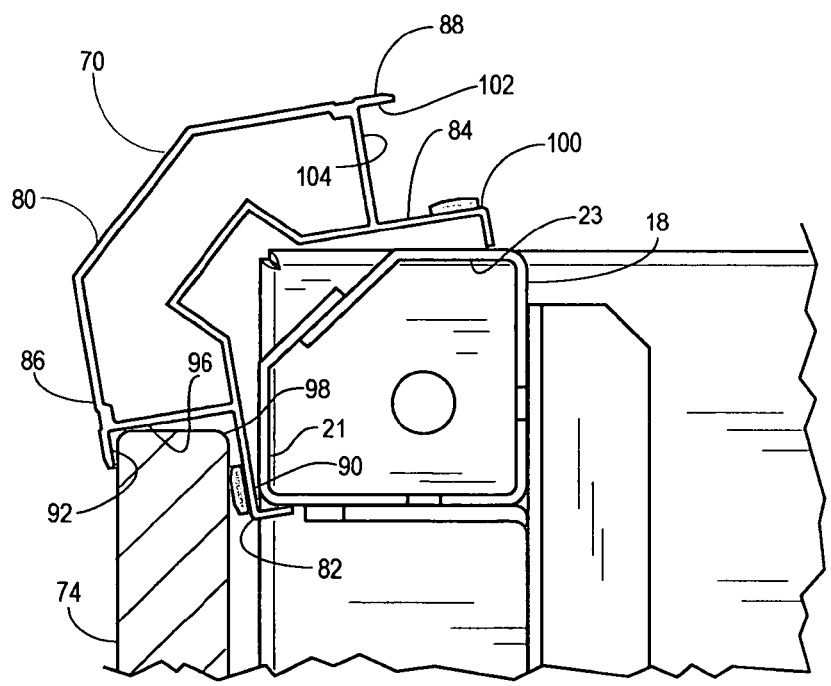
FIG. 7 is a top view of a post trim of the cabinet in an unsecured position.
Figure 8:
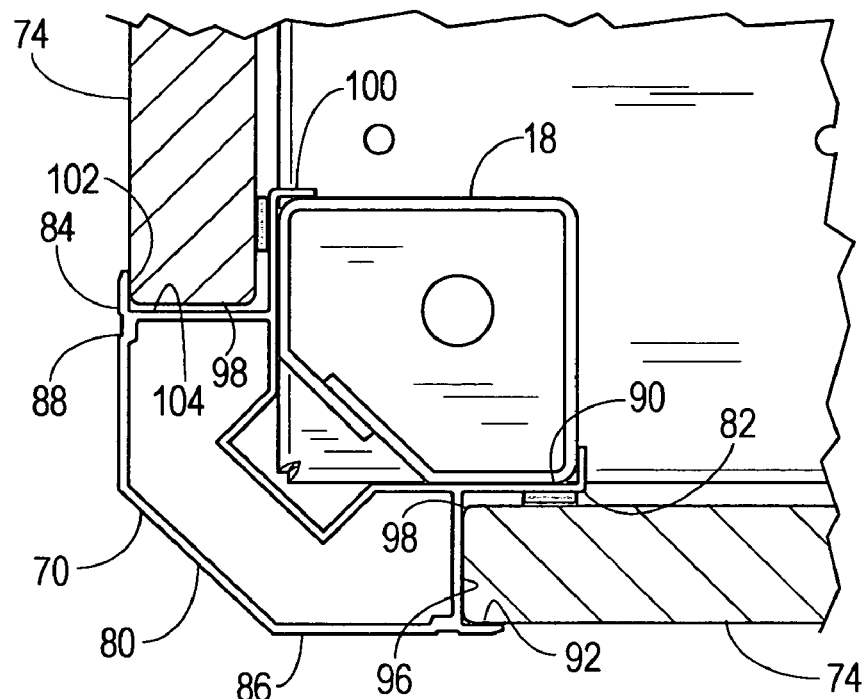
FIG. 8 is a top view of the post trim of FIG. 7 in a secured position.

The chassis structure 17 is positioned in the cavity 16 and connected to the posts 18 with the twin axis mounting system 50. Next, each post trim 70 is connected to each post 18. The L-shaped flange 90 of the first connector 82 engages the first portion 21 of the post 18 placing the post trim 70 in an unsecured position, as shown in FIG. 7. The L-shaped flange 100 of the second connector 84 engages the second portion 23 of the post 18 connecting the post trim 70 to the post 18 and thereby placing the post trim 70 in a secured position (FIG. 8). The edge 98 of the panel 74 is positioned in the channel 104. The channel 104 matingly receives the edge 98 of the panel 74. The process is repeated on each corner until the post trim 70 is connected to each post 18. In the preferred embodiment, the post trims 70 'snap-on' to the posts 18 while the edge 98 of the panel is positioned in the channel 104 to simultaneously captivate the side and rear panels 74 using the compression fittings 116.

The captivated side/rear panel concept provides precise ingress protection (IP) compression seals to protect the internal equipment from water and dust and other environmental hazards, and EMC seals in the vertical axis to prevent unwanted electromagnetic radiation from escaping the cabinet.

In one preferred embodiment, the side panel is 20 mm deep, the EMC/IP seals are 4 mm, the captivating slot in the extrusion is 22 mm. This results in a minimum of 2 mm of compression on the seals when the panel is captivated providing for a maximum 50% compression of the seals. At this level of compression, there is minimal risk of over or under compression of the seals, which can drastically reduce the effectiveness of seals.

The same compression is achieved in the seals utilized in the horizontal plane by use of horizontal clamping/compression brackets. Positively located horizontal clamping/compression brackets ensure precise compression of IP and EMC seals in horizontal axis.

Both indoor and outdoor embodiments of the present invention use the same principal as described herein. However, the raw materials used are chosen to fit the environmental conditions to which the enclosure will be exposed. By way of example, and not as a limitation, the side panel used in an indoor application may be acceptably fabricated from 0.8 mm Zintec while a side panel for outdoor use would be fabricated from 2.0 mm aluminum.

The present invention is further adaptable to various roof and top panel designs. Cable entry can be made in the side, rear, and roof/top panels as required. Additionally, a range of standard heat management systems can be fitted both internally and externally as required.

The precision location of the corner post to the base/top panel/plate ensures consistently accurate placement and fixing of the frame structure. The folded box section construction gives the strength of a standard box section, but without the need to machine holes and cutout profiles on dedicated machines or use more expensive welding or extruding equipment. All holes and profiles are generated while the sheet is flat. The modular nature of the construction makes the present invention suitable for use with "flat pack" assemblies.

The cabinet 10 is provided with modular construction and is typically configured for supporting electronic equipment 120, such as a server or telecom equipment. The cabinet 10 can be shipped when unassembled and then assembled on-site without any sacrifice of structural integrity or quality of the finally assembled cabinet 10. The cabinet 10 is typically supplied complete with front/rear doors, side panels, top and base plates, fan plate assembly, adjustable feet, grounding kit, depth members and adjustable mounting verticals. Other optional accessory parts, include plain/vented front panels, cable trays, chassis runners, sliding shelves, fixed shelves, front stabilizing foot, and castors.

While presently preferred embodiments of the present invention have been described herein, one skilled in the art will recognize that many changes or alterations can be made to the preferred embodiments without departing from the spirit and scope of the present invention. It is therefore intended that all such modifications, alterations and other changes be encompassed by the claims.

What is claimed is:

1. A method for assembling a cabinet for supporting electronic equipment, comprising the steps of:
   a. connecting a plurality of posts to an upper or lower panel to form a rigid internal structure;
   b. connecting a chassis structure defining a cavity into which the electronic equipment can be fitted to the rigid internal structure;
   c. connecting at least two post trims to the rigid internal structure with snap fittings;
   d. connecting at least one panel to the at least two post trims with compression fittings; and
   wherein the steps c. and d. are defined further as connecting each post trim to a respective post of the plurality of posts wherein an L-shaped flange of a first connector of each post trim engages a first portion of the respective post and wherein a channel of the first connector formed from a shoulder spaced a distance from the L-shaped flange matingly receives an edge from the at least one panel and a second connector of each post trim cooperates with the first connector to connect each post trim to the respective post.

2. A method for assembling a cabinet for supporting electronic equipment, comprising the steps of:
   a. connecting four posts to an upper panel and a lower panel to form a rigid internal structure;
   b. connecting a chassis structure defining a cavity into which the electronic equipment can be fitted to the rigid internal structure;
   c. connecting four post trims to the rigid internal structure with snap fittings;
   d. connecting three panels to the four post trims with compression fittings; and
   wherein steps c. and d. are defined further as connecting each post trim to a respective post of the rigid internal structure wherein an L-shaped flange of a first connector of each post trim engages a first portion of the respective post and an L-shaped flange of a second connector of each post trim engages a second portion of the respective post, wherein a channel of the second connector formed from a shoulder spaced a distance from the L-shaped flange of the second connector matingly receives an edge from one of the panels, and wherein the second connector of each post trim cooperates with the first connector of each post trim to connect the post trim to the respective post.

* * * * *